United States Patent
Konno

(10) Patent No.: US 8,721,931 B2
(45) Date of Patent: May 13, 2014

(54) PASTE FOR SOLAR CELL ELECTRODE, SOLAR CELL ELECTRODE MANUFACTURING METHOD, AND SOLAR CELL

(75) Inventor: Takuya Konno, Tochigi-ken (JP)

(73) Assignee: E I du Pont de Nemours and Company, Wilmington, DE (US)

( * ) Notice: Subject to any disclaimer, the term of this patent is extended or adjusted under 35 U.S.C. 154(b) by 1448 days.

(21) Appl. No.: 11/451,978

(22) Filed: Jun. 13, 2006

(65) Prior Publication Data

US 2007/0138659 A1    Jun. 21, 2007

(51) Int. Cl.
*H01B 1/02*    (2006.01)

(52) U.S. Cl.
USPC ...... 252/520.3; 136/256; 252/500; 252/518.1

(58) Field of Classification Search
USPC ........... 136/256; 257/746, 253; 252/512, 500, 252/518.1, 520.3
See application file for complete search history.

(56) References Cited

U.S. PATENT DOCUMENTS

| | | |
|---|---|---|
| 4,737,197 A | 4/1988 | Nagahara et al. |
| 5,428,249 A * | 6/1995 | Sawayama et al. ........... 257/746 |
| 2006/0038304 A1* | 2/2006 | Osako et al. ................. 257/789 |

FOREIGN PATENT DOCUMENTS

| | | |
|---|---|---|
| EP | 0452118 | 10/1991 |
| EP | 0778624 | 7/1997 |
| EP | 1339073 | 8/2003 |
| EP | 1560227 | 8/2005 |
| JP | H06-125100 A | 5/1994 |
| JP | 11-330512 A | 11/1999 |
| JP | 2001-015782 A | 1/2001 |
| JP | 2001-127317 A | 5/2001 |
| JP | 2001-313400 A | 11/2001 |
| JP | 2004-100013 A | 4/2002 |
| JP | 2003-049202 A | 2/2003 |
| JP | 2003-133567 A | 5/2003 |
| JP | 2003-223813 A | 8/2003 |
| JP | 2003/323815 A | 11/2003 |
| JP | 2004/134656 A | 4/2004 |
| JP | 2004/146154 A | 5/2004 |
| JP | 2004-146521 A | 5/2004 |
| JP | 2005-243500 A | 9/2005 |

OTHER PUBLICATIONS

European Search Report, Application No. 06023200.6, dated Mar. 23, 2007.

* cited by examiner

*Primary Examiner* — Thanh-Truc Trinh

(57) ABSTRACT

The present invention pertains to an electroconductive paste for a solar cell electrode, which includes a first silver powder with a crystallite size of 58 nm, a second silver powder with a different crystallite size from that of the first silver powder, glass frit, and resin binder. The present invention also provides a solar cell having an electrode containing the aforementioned electroconductive paste.

6 Claims, 2 Drawing Sheets

US 8,721,931 B2

PASTE FOR SOLAR CELL ELECTRODE, SOLAR CELL ELECTRODE MANUFACTURING METHOD, AND SOLAR CELL

FIELD OF THE INVENTION

The present invention pertains to a solar cell. More specifically, the present invention pertains to a paste used for manufacturing the electrode in a solar cell, a method for manufacturing a solar cell using the aforementioned paste, and the obtained solar cell.

BACKGROUND OF THE INVENTION

When manufacturing an electrode for a solar cell, the electrode is formed on the side where an anti-reflection film is formed. To form the electrode, a paste containing an electroconductive powder, such as a silver powder, glass frit, resin binder, and, if necessary, other additives is coated on the anti-reflection layer, followed by sintering.

The characteristics of the electrode are important in improving the power-generation characteristic of the solar cell. For example, the power-generation efficiency can be increased by reducing the resistance of the electrode. Various methods have been proposed in order to realize this objective.

For example, Japanese Patent Laid-Open No. 2005-243500A discloses a technology for manufacturing an electrode with sufficient conductivity. More specifically, the patent reference discloses an electroconductive paste containing an organic binder, solvent, glass frit, electroconductive powder, and at least one metal selected from Ti, Bi, Zn, Y, In, and Mo or a compound of that metal. The average particle size of the metal or its compound in the electroconductive paste is larger than 0.001 µm but smaller than 0.1 µm. The electroconductive paste can provide high conductivity with respect to semiconductors, along with excellent adhesion properties.

SUMMARY OF THE INVENTION

The present invention relates to a paste containing a first silver powder with a crystallite size of 58 nm or larger, a second silver powder having a different crystallite size from that of the first silver powder, a glass frit, and a resin binder, wherein the paste is useful in the manufacture of a solar cell electrode.

The present invention further relates to a solar cell having an electrode comprising a first silver powder with a crystallite size of 58 nm or larger, a second silver powder having a different crystallite size from that of the first silver powder, and a glass frit.

DETAILED DESCRIPTION

Figure 1A:
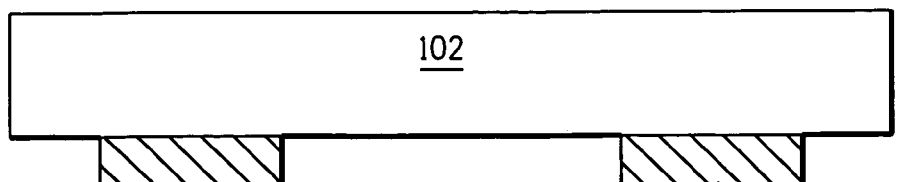
FIGS. 1(a)-(d) explain the manufacturing process when manufacturing a solar cell using the electroconductive paste of the present invention.
Figure 1B:
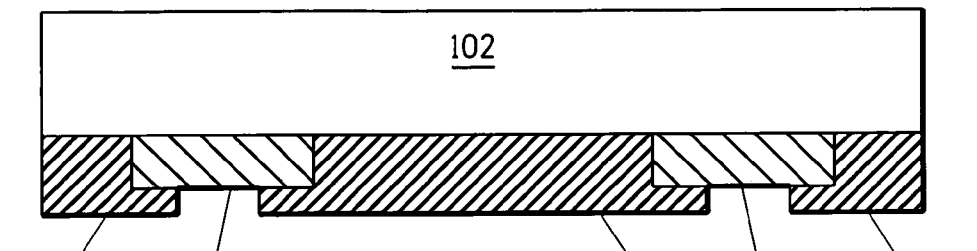

During sintering of the paste, due to shrinkage of the coating film, the contact resistance will increase, and micro-cracks will occur. These problems will adversely affect the characteristics of the solar cell. For example, the in-plane uniformity of the solar cell will deteriorate, and the conversion efficiency of the solar cell becomes low.

The purpose of the present invention is to solve the aforementioned problems by improving the characteristics of the obtained electrode, and furthermore to improve the characteristics of the solar cell.

The present invention provides an electroconductive paste for a solar cell electrode containing a first silver powder with a crystallite size of 58 nm or larger, a second silver powder having a different crystallite size from that of the aforementioned silver powder, glass frit, and resin binder.

The present invention also provides a solar cell having an electrode containing a first silver powder with a crystallite size of 58 nm or larger, a second silver powder having a different crystallite size from that of the aforementioned silver powder, and glass frit.

In the aforementioned electroconductive paste and solar cell, the first silver powder is preferred to have the following characteristics. (1) It is preferred to manufacture the first silver powder using the atomization method. (2) The shrinkage-starting temperature of the first silver powder is preferably 700° C. or higher. (3) The content of the first silver powder is preferably in the range of 10-70 wt %, based on the total weight of the silver. (4) The crystallite size of the first silver powder is preferably in the range of 58-90 nm, and the crystallite size of the second silver powder is preferably in the range of 30-58 nm.

The increase in the contact resistance and occurrence of micro-cracks can be restrained. As a result, the characteristics of the obtained solar cell can be improved.

It was found that the increase in the contact resistance and occurrence of micro-cracks could be suppressed by using a silver powder with a specific crystallite size as the electroconductive powder in the paste. The present invention was achieved based on this.

The present invention provides an electroconductive paste for a solar cell electrode containing a first silver powder with a crystallite size of 58 nm or larger, a second silver powder having a different crystallite size from that of the aforementioned silver powder, glass frit, and a resin binder.

The electroconductive paste of the present invention is used to form the electrode on the surface of a solar cell.

In the following, each component in the electroconductive paste of the present invention will be explained.

1. Electroconductive Metal

It is preferred to use silver (Ag) particles as the electroconductive metal in the electroconductive paste of the present invention.

The silver particles used in the present invention have a crystallite size in a prescribed range. It is more preferred to use two types of silver particles with different crystallite sizes as the electroconductive metal.

In this specification, the crystallite size is calculated based on the following equation (Scherrer equation) from the half-value width of the 111 reflection peak of Ag (peak near 2θ: about 38.1°) in the X-ray diffraction measurement of the Ag powder. The larger the crystallite size, the better the crystallinity.

$$D = K \cdot \lambda / \beta \cos \theta$$

Where
D: Crystallite size
$\lambda$: Wavelength of X-rays used for measurement
$\beta$: Half-value width (radian)

θ: Diffraction angle

K: Scherrer constant (0.9)

The crystallite size specified in the present invention is the value obtained when Cu=1.54056 Å is used as λ (wavelength of X-rays used for measurement). There is no special limitation on the device used for measuring the crystallite size. Any commercially available device can be used, such as the MXP18VAHF x-ray diffraction device. In this patent application:

A first silver powder with a crystallite size of 58 nm or larger and a second silver powder with a different crystallite size from that of the first silver powder are used as the silver particles. The crystallite size of the first silver powder is preferably in the range of 58-90 nm. The crystallite size of the second silver powder is in the range of 30-58 nm, preferably in the range of 35-50 nm, and more preferably in the range of 40-45 nm. When silver powders having crystallite sizes in these ranges are combined, the increase in the contact resistance and the occurrence of micro-cracks in the silver electrode formed after sintering can be restrained.

The content of the first silver powder is preferably in the range of 10-70 wt %, more preferably in the range of 20-55 wt %, and most preferably in the range of 25-45 wt %, based on the total amount of silver. It is believed that silver particles with a large crystallite size, such as the first silver powder, have high a sintering restricting effect. On the other hand, in order to obtain a high electroconductivity, it is preferred to improve the sintering property to obtain a low-resistance conductor. The aforementioned range is preferred in consideration of the balance between the above-mentioned properties. If the content of the first silver powder is too small, excessive sintering will be caused. If the content is too large, insufficient sintering will be caused. The total content of the first and second silver powders is preferably in the range of 60-90 wt %, based on the weight of the electroconductive paste.

The shrinkage-starting temperature (also known as sintering-starting temperature) of the first silver powder is preferably 700° C. or higher. If sintering is started at a low temperature, excessive residual stress will be generated due to shrinkage. As a result, the power-generation characteristic may deteriorate.

It is preferred to form the silver particles using the atomization method. The silver particles having a crystallite size in the specific range of the present invention can be efficiently obtained if the silver particles are formed using said atomization method.

There is no special limitation on the particle size of the silver particles with respect to the technical effect when it is used as a general electroconductive paste. However, since the particle size has an influence on the sintering characteristic of silver (for example, silver particles with a large particle size are sintered at a slower rate than silver particles with a small particle size), it is preferred to use silver particles with a specific particle size for the purpose of the present invention. The silver particles must also have a particle size suitable for the method used for coating the electroconductive paste (for example, the screen printing method).

In order to satisfy the aforementioned requirement, the silver particles used in the present invention have an average particle size in the range of 0.1-14 μm, preferably in the range of 1.0-8.0 μm. When silver particles with a particle size in the aforementioned range are used, a paste suitable for coating of the electroconductive paste can be formed. More specifically, the average particle size of the first silver powder is preferably in the range of 3.5-14.0 μm, more preferably in the range of 4.0-10.0 μm, and most preferably in the range of 4.5-8.0 μm.

The average particle size of the second silver powder is preferably in the range of 0.1-3.5 μm, more preferably in the range of 0.5-3.0 μm, and most preferably, in the range of 1.0-2.5 μm. The average particle size is calculated (accumulated 50% point in particle size distribution) from the values measured by the LA-920 device produced by Horiba, Ltd.

It is usually preferred to use silver with high purity (99+%). However, it is also possible to use silver with low purity, depending on the electrical requirement of the electrode pattern.

2. Glass Frit

It is preferred that the electroconductive paste of the present invention contain glass frit as the inorganic binder. A glass binder that can be used in the present invention is glass frit having a softening point in the range of 450-550° C. so that the electroconductive paste can be sintered at 600-800° C. and wetted appropriately, as well as bonded appropriately to the silicon substrate. If the softening point is lower than 450° C., sintering cannot be carried out, and the effect of the present invention cannot be well realized. On the other hand, if the softening point is higher than 550° C., good melting and flowing will not occur during sintering. As a result, a good adhesion strength cannot be realized, and it is unable to accelerate liquid-phase sintering of the silver.

Said "softening point" is measured using the fiber elongation method of ASTM C338-57.

Since the chemical composition of the glass frit is not important in the present invention, any glass frit used for electroconductive pastes for electronic material can be used in the present invention. For example, lead borosilicate glass can be used. Lead silicate glass and lead borosilicate glass are preferred materials for the present invention in consideration of both the range of softening point and the glass fusibility. It is also possible to use zinc borosilicate or other types of inorganic glass.

There is no special limitation on the content of the glass frit as long as the objective of the present invention can be realized. The content of glass frit is usually in the range of 0.5-10.0 wt %, preferably in the range of 1.0-3.0 wt %, based on the weight of the electroconductive paste.

If the amount of the glass frit is less than 0.5 wt %, the adhesion strength may not be high enough. If the amount of the glass frit is more than 10.0 wt %, problems may be caused in the next step, that is, soldering due to floating glass, etc.

3. Resin Binder

The electroconductive paste of the present invention contains a resin binder. In this specification, "resin binder" includes the concept of a mixture of a polymer and thinner. Consequently, the resin binder may also contain an organic liquid (also known as "thinner"). In the present invention, it is preferred to use a resin binder containing an organic liquid. If the viscosity is high, if necessary, it is also possible to add the organic liquid separately as a viscosity adjusting agent.

Any resin binder can be used in the present invention. Examples of the resin binder that can be used in the present invention include a pine oil solution or ethylene glycol monobutyl ether monoacetate solution of a resin (polymethacrylate, etc.) or ethylcellulose, terpineol solution of ethylcellulose, etc. It is preferred to use the terpineol solution of ethylcellulose (ethylcellulose content=5 wt % to 50 wt %) in the present invention. It is possible to use a solvent containing no [special] polymer, such as water or an organic liquid, as the viscosity adjusting agent in the present invention. Examples of the organic liquid that can be used include an alcohol, ester of alcohol (such as acetate or propionate), or terpene (such as pine oil, terpineol, etc.).

The content of the resin binder is preferably in the range of 5-50 wt %, based on the weight of the electroconductive paste.

4. Additives

It is also possible to add thickeners and/or stabilizers and/or other general additives into the electroconductive paste of the present invention. When additives are added, thickeners, stabilizers, etc., can be added. It is also possible to add dispersants, viscosity adjusting agents, etc., as the general additives. The amount of the additives is determined depending on the characteristics of the finally obtained electroconductive paste. The amount of the additives can be determined appropriately by the specialists in this field. It is also possible to add multiple types of additives.

As to be explained below, the electroconductive paste of the present invention is preferred to have a viscosity in a prescribed range. In order to provide the electroconductive paste with an appropriate viscosity, a thickener can be added as demanded. Examples of the thickener listed above can be used. The amount of the thickener added varies depending on the viscosity of the final electroconductive paste and can be determined appropriately by the specialists in this field.

The electroconductive paste of the present invention can be manufactured by mixing the aforementioned components with a 3-roll blender. It is preferred to coat the electroconductive paste of the present invention in a desired part on the back of a solar cell by means of screen printing. When the paste is coated using this printing method, a voltage in the prescribed range can be obtained. The viscosity of the electroconductive paste of the present invention is preferably in the range of 50-300 PaS when it is measured at 10 rpm and 25° C. with a Brook Field HBT viscometer using #14 spindle and a utility cup.

As described above, the electroconductive paste of the present invention is used to form an electrode mainly composed of silver on the light-receiving side of a solar cell. In other words, the paste is coated and dried on the light-receiving side of the solar cell. It is also possible to coat the paste on the backside of a solar cell to form a back electrode composed of aluminum or silver, etc. It is preferred to sinter these electrodes at the same time.

In the following, an example of using the electroconductive paste of the present invention in the manufacture of solar cell will be explained based on FIG. 1.

First, Si substrate 102 is prepared. Electroconductive paste 104 used for solder connection is coated by means of screen printing, then dried on the backside of the substrate (FIG. 1(a)). The electroconductive paste can be a conventional silver electroconductive paste containing, for example, silver particles, glass particles, and a resin binder. An aluminum paste for the back electrode of the solar cell (there is no special limitation on the aluminum paste used as long as it can be used for a solar cell; examples include Commercial Product Nos. PV333, PV322 (available from E. I. du Pont de Nemours and Company) 106, etc.) is then coated by means of screen printing, then dried (FIG. 1(b)). The drying temperature for each paste is preferably 180° C. or lower. The film thickness of each electrode on the back after drying is preferably in the range of 20-40 μm for the aluminum paste and in the range of 15-30 μm for the silver electroconductive paste. The thickness in the area where the aluminum paste and the silver electroconductive paste are superimposed is preferably in the range of about 0.5 mm to 2.5 mm.

Figure 1C:
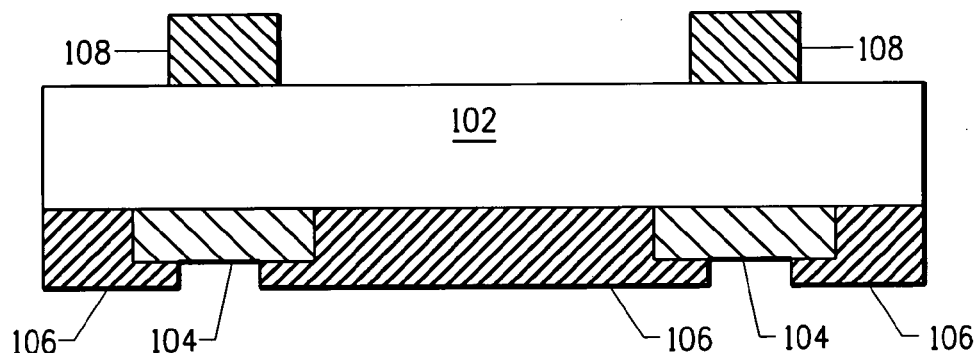

Electroconductive paste 108 of the present invention is then coated by means of screen printing, etc., then dried on the light-receiving surface of the Si substrate (FIG. 1(c)). The aluminum paste and the silver electroconductive paste on the obtained substrate are sintered simultaneously at a temperature in the range of about 600-900° C. for about 2-15 min in an IR sintering furnace. In this way, the desired solar cell can be obtained (FIG. 1(d)).

Figure 1D:
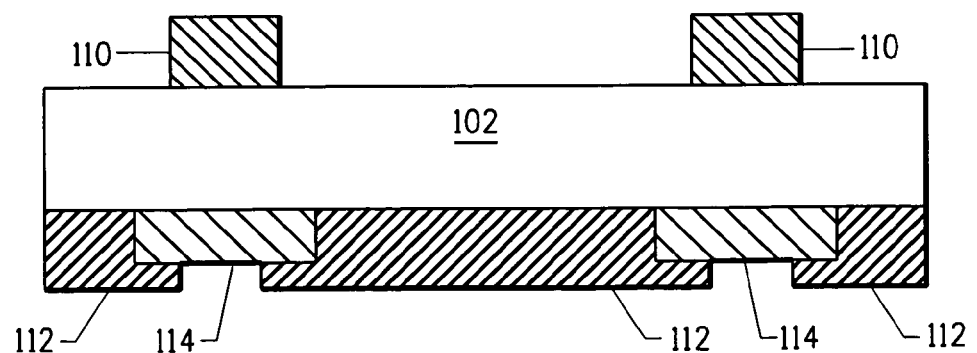

As shown in FIG. 1(d), the solar cell manufactured using the electroconductive paste of the present invention has electrode 110 made of the electroconductive paste of the present invention on the light-receiving side (surface) of the substrate (such as Si substrate) 102 and has Al electrode (first electrode) 112 mainly composed of Al and a silver electrode (second electrode) 114 mainly composed of Ag on the backside.

EXAMPLES

1. Preparation of the Electroconductive Paste

Application Example 1

A mixture containing a first silver powder with a crystallite size of 59.8 nm, a second silver powder with a crystallite size of 43.5 nm, Si—B—Pb—O type glass frit, and sintering-assisting materials was prepared. A terpineol solution containing 20 wt % of ethylcellulose was added as a resin binder into this mixture. To adjust the viscosity, terpineol was added as a thinner. The content of each component is listed in Table 1. The content of the first silver powder with a crystallite size of 58 nm or larger was 8.4 wt %, the content of the second silver powder with a crystallite size of 43.5 nm was 75.6 wt %, the content of the glass frit was 1.6 wt %, the content of resin binder was 10.0 wt %, the content of the terpineol added in order to adjust the viscosity was 0.9 wt %, and the content of the sintering-assisting material was 3.5 wt %.

After the mixture was premixed in a universal mixer, it was kneaded using a 3-roll kneader to obtain a paste for a solar cell paste. The particle sizes, contents, and characteristics, etc., of the materials used are shown in Table 1.

Application Example 2, Comparative Examples 1-2

A paste for a solar cell electrode was prepared in the same way as described in Application Example 1 except that the types and amounts of the silver powders used were changed to those shown in Table 1.

TABLE 1

| | | Application Example 1 | Application Example 2 | Application Example 3 | Comparative Example 1 | Comparative Example 2 | Comparative Example 3 | Comparative Example 4 |
|---|---|---|---|---|---|---|---|---|
| First silver powder | Crystallite size (nm) | 59.8 | 59.8 | 86.9 | — | 59.8 | 52.3 | 54.4 |
| | Particle size (μm) | 5.5 | 5.5 | 7.1 | — | 5.5 | 2.6 | 1.9 |
| | wt % | 8.4 | 24 | 24 | — | 84 | 24 | 14 |
| Second silver powder | Crystallite size (nm) | 43.5 | 43.5 | 43.5 | 43.5 | — | 43.5 | 43.5 |
| | Particle size (μm) | 1.7 | 1.7 | 1.7 | 1.7 | — | 1.7 | 1.7 |
| | wt % | 75.6 | 60 | 60 | 84 | — | 60 | 70 |

TABLE 1-continued

|  |  | Application Example 1 | Application Example 2 | Application Example 3 | Comparative Example 1 | Comparative Example 2 | Comparative Example 3 | Comparative Example 4 |
|---|---|---|---|---|---|---|---|---|
| Glass frit | wt % | 1.6 | 1.6 | 1.6 | 1.6 | 1.6 | 1.6 | 1.6 |
| Resin binder | wt % | 10.0 | 10.0 | 10.0 | 10.0 | 10.0 | 10.0 | 10.0 |
| Viscosity adjusting agent | wt % | 0.9 | 0.9 | 0.9 | 0.9 | 0.9 | 0.9 | 0.9 |
| Additive | wt % | 3.5 | 3.5 | 3.5 | 3.5 | 3.5 | 3.5 | 3.5 |

2. Manufacture of Solar Cell

The obtained 4 types of pastes were used to manufacture solar cells. First, the Si substrate was prepared. An electroconductive paste (silver paste) for solder connection was coated by means of screen printing, then dried on the backside of the Si substrate. Next, an aluminum paste for the back electrode, Commercial Product No. PV333 (available from E. I. du Pont de Nemours and Company) was coated by means of screen printing, then dried such that it was partially superimposed with the dried silver paste. The drying temperature of each paste was 120° C. The film thickness of each electrode on the backside after drying was 35 μm for the aluminum paste and 20 μm for the silver paste.

Also, the paste of the present invention was coated by means of screen printing, then dried on the light-receiving side (surface). The printer used was produced by the Price Corporation, and the mask used was a stainless steel wire 250-mesh mask with an 8 inch×10 inch frame. The pattern was a 1.5-inch square pattern for evaluation comprised of 100-μm-wide finger liens and 2-mm-wide bus bars. The film thickness after sintering was 13 μm.

The paste coated on the substrate was then sintered simultaneously in an IR sintering furnace under the conditions of peak temperature: about 730° C. and IN-OUT time: about 5 min. As a result, the desired solar cell was obtained.

As shown in FIG. 1, the solar cell obtained using the electroconductive paste of the present invention had Ag electrode 110 on the light-receiving side (surface) of substrate (such as Si substrate) 102, Al electrode (first electrode) 112 mainly composed of Al, and silver electrode (second electrode) 114 mainly composed of silver on the backside.

3. Cell Evaluation

Figure 2:
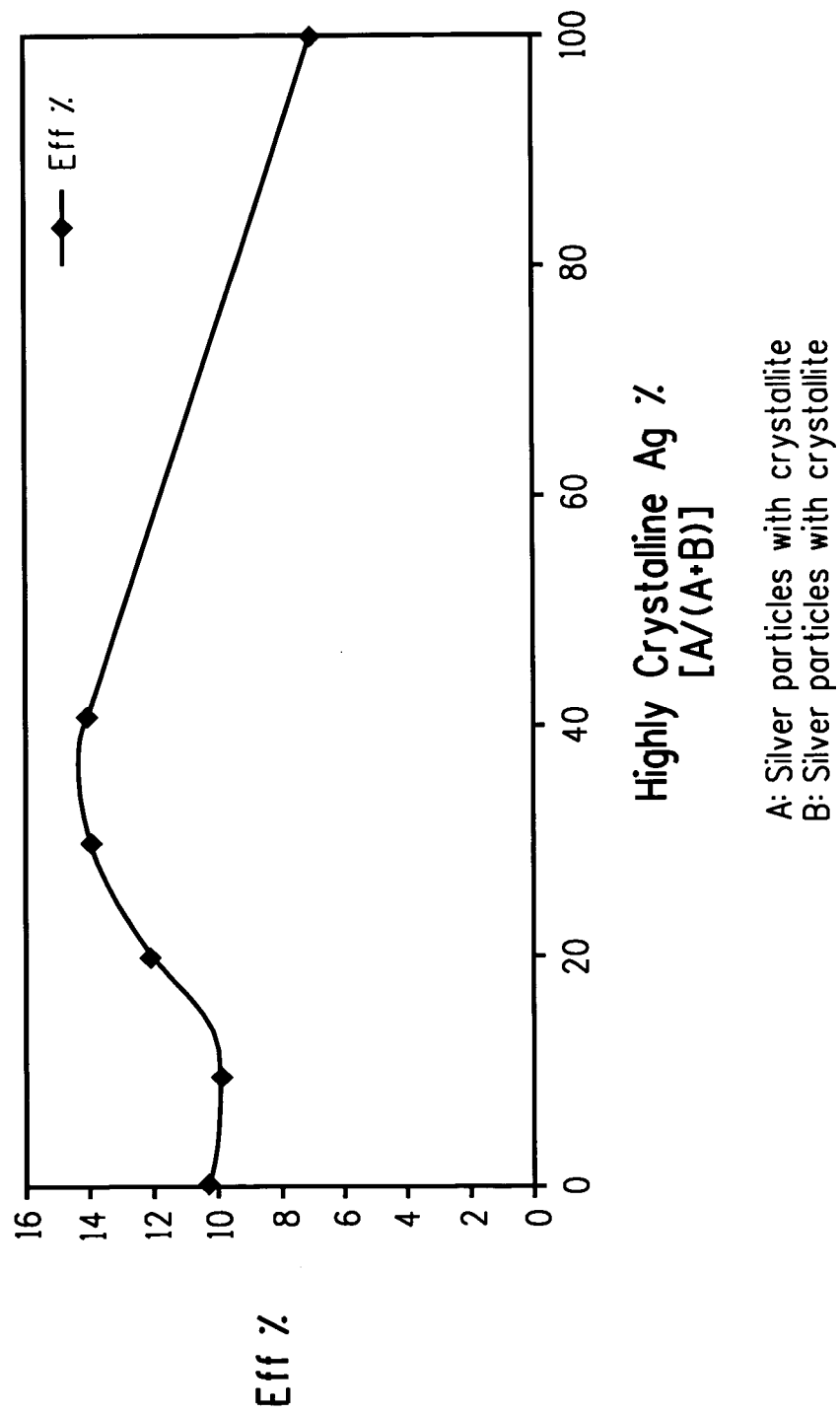
FIG. 2 is a diagram illustrating the results of measuring the electrical characteristics of the solar cells manufactured when the contents of the first and second silver powders are varied, in order to estimate the best contents of the silver powders.

The electrical characteristics (I-V characteristic) of the obtained solar cell substrate were evaluated using a cell tester. The cell tester used was a tester (NCT-M-150AA) produced by the NPC Corporation. The obtained characteristic values were Eff: Conversion efficiency (%), FF: Fill factor (%), Voc: Open voltage (mV), Jsc: Short-circuit current (mA·cm$^2$), Rs: serial resistance (Ω·cm$^2$), Rsh: Shunt resistance (Ω·cm$^2$). The larger the characteristic values, except for Rs, the better the power-generation performance of the solar cell. The results are shown in Table 2. The value of each electrical characteristic shown in FIG. 2 was the average of the values measured for 5 solar cell substrates. It was the relative value with respect to 100.0, which was the value of Comparative Example 1.

TABLE 2

| Paste composition | Eff % | FF % | Voc mV | Jsc mA/cm$^2$ | Rs ohm × cm$^2$ | Rsh ohm × cm$^2$ |
|---|---|---|---|---|---|---|
| Comparative Example 1 | 100.0 | 100.0 | 100.0 | 100.0 | 100.0 | 100.0 |
| Comparative Example 2 | 94.6 | 98.7 | 94.0 | 105.8 | 82.4 | 88.1 |
| Comparative Example 3 | 81.8 | 89.6 | 99.3 | 93.4 | 106.3 | 69.0 |
| Comparative Example 4 | 106.0 | 105.2 | 101.5 | 98.8 | 111.0 | 109.6 |
| Application Example 1 | 114.4 | 103.5 | 105.7 | 108.3 | 97.0 | 113.4 |
| Application Example 2 | 174.5 | 138.9 | 107.6 | 121.3 | 27.6 | 270.7 |
| Application Example 3 | 163.7 | 145.7 | 101.5 | 112.8 | 27.9 | 199.7 |

As described above, the configuration of the obtained solar cell can be improved by using two types of silver powders having prescribed crystallite sizes specified in the present invention.

Application Example 3

A test for estimating the appropriate content of the first silver powder among the silver powders was carried out. A silver powder with a crystallite size of 59.8 nm (shrinkage-starting temperature 740° C.) was used as the first silver powder (A), and a silver powder with a crystallite size of 43.5 nm (shrinkage-starting temperature 670° C.) was used as the second silver powder (B). The composition ratios of the first and second silver powders were varied as show in Table 4 below. Electroconductive pastes and solar cell substrates were prepared in the same way as described in Application Examples 1 and 2. The conversion efficiency (Eff) of the obtained solar cells was measured. The results are shown in Table 3. The results of Table 3 were also graphed in FIG. 2.

TABLE 3

| | Composition ratio (wt %) | | | | | |
|---|---|---|---|---|---|---|
| Ag powder | (1) | (2) | (3) | (4) | (5) | (6) |
| First silver powder (A) | 100 | 40 | 30 | 20 | 10 | 0 |
| Second silver powder (B) | 0 | 60 | 70 | 80 | 90 | 100 |
| Eff (%) | 6.96 | 14.18 | 14.25 | 12.3 | 9.98 | 10.36 |

As can be seen from the aforementioned results, the appropriate content of the first silver powder was estimated to be in the range of 10-70 wt %, based on the total weight of the silver.

What is claimed is:

1. A paste containing:
a first silver powder with a crystallite size of 58-90 nm,
a second silver powder with a crystallite size of 30-58 nm, wherein the first silver powder is 20-45 wt % based on the total weight of the first silver powder and the second silver powder,
a glass frit, and
a resin binder, wherein the paste is useful in the manufacture of a solar cell electrode, and wherein the crystallite size is calculated based on the following equation (1), $$D = K \cdot \lambda / \beta \cos \theta \qquad (1)$$

D: Crystallite size
λ: Wavelength of X-rays used for measurement
β: Half-value width (radian) of the 111 reflection peak of Ag in the X-ray diffraction measurement
θ: Diffraction angle
K: Scherrer constant (0.9).

2. The paste of claim 1, wherein the first silver powder is manufactured using the atomization method.

3. The paste of claim 1, wherein the shrinkage starting temperature of the first silver powder is 700° C. or higher.

4. A solar cell having an electrode comprising a first silver powder with a crystallite size of 58-90 nm, a second silver powder with a crystallite size of 30-58 nm, wherein the first silver powder is 20-45 wt %, based on the total weight of the first silver powder and the second silver powder, and a glass frit, wherein the crystallite size is calculated based on the following equation (1), $$D = K \cdot \lambda / \beta \cos \theta \qquad (1)$$

D: Crystallite size
λ: Wavelength of X-rays used for measurement
β: Half-value width (radian) of the 111 reflection peak of Ag in the X-ray diffraction measurement
θ: Diffraction angle
K: Scherrer constant (0.9).

5. The solar cell of claim 4, wherein the first silver powder is manufactured using the atomization method.

6. The solar cell of claim 4, wherein the shrinkage-starting temperature of the first silver powder is 700° C. or higher.

* * * * *